(12) United States Patent
Maeda

(10) Patent No.: US 9,813,679 B2
(45) Date of Patent: *Nov. 7, 2017

(54) SOLID-STATE IMAGING APPARATUS WITH ON-CHIP LENS AND MICRO-LENS

(71) Applicant: SONY CORPORATION, Tokyo (JP)

(72) Inventor: Kensaku Maeda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 38 days.

This patent is subject to a terminal disclaimer.

(21) Appl. No.: 14/808,101

(22) Filed: Jul. 24, 2015

(65) Prior Publication Data

US 2015/0334358 A1     Nov. 19, 2015

Related U.S. Application Data

(63) Continuation of application No. 13/635,262, filed as application No. PCT/JP2012/050837 on Jan. 17, 2012, now Pat. No. 9,110,210.

(30) Foreign Application Priority Data

Jan. 26, 2011 (JP) ................. 2011-014111

(51) Int. Cl.
| | |
|---|---|
| H01L 27/146 | (2006.01) |
| H04N 9/04 | (2006.01) |
| H04N 5/378 | (2011.01) |
| H04N 5/376 | (2011.01) |
| H04N 5/374 | (2011.01) |
| G02B 3/00 | (2006.01) |

(52) U.S. Cl.
CPC .............. *H04N 9/045* (2013.01); *G02B 3/005* (2013.01); *G02B 3/0056* (2013.01); *G02B 3/0068* (2013.01); *H01L 27/14627* (2013.01); *H01L 27/14685* (2013.01); *H04N 5/374* (2013.01); *H04N 5/378* (2013.01); *H04N 5/3765* (2013.01)

(58) Field of Classification Search
CPC ............. H01L 27/1468; H01L 27/1462; H01L 27/14625; H01L 27/14627; H01L 27/146; G02B 3/0056; G02B 3/0062; G02B 27/0961; H04N 5/2254; H04N 5/232
USPC ........................ 250/208.1, 216, 214 R, 239; 257/432–436, 440–444; 348/271–290
See application file for complete search history.

(56) References Cited

U.S. PATENT DOCUMENTS 6,903,391 B2 * 6/2005 Takeuchi .......... H01L 27/14843
257/222

* cited by examiner

*Primary Examiner* — Que T Le
(74) *Attorney, Agent, or Firm* — Chip Law Group

(57) ABSTRACT

The present technology relates to a solid-state imaging apparatus that can provide a compound-eye system solid-state imaging apparatus capable of capturing an image with high image quality regardless of use environments, a method of manufacturing a solid-state imaging apparatus, and an electronic apparatus. The solid-state imaging apparatus includes photoelectric conversion units (21) that are two-dimensionally arranged, on-chip lenses (27a) that are two-dimensionally arranged on an upper side of the photoelectric conversion units (21) in correspondence with the photoelectric conversion units (21), a micro-lens (10a) that is arranged so as to face each plurality of the on-chip lenses (27a), and a transparent material layer that is pinched between the on-chip lenses (27a) and the micro-lens (10a) and are configured by a first intermediate layer (29) and a second intermediate layer (31).

8 Claims, 11 Drawing Sheets

[FIG.1]
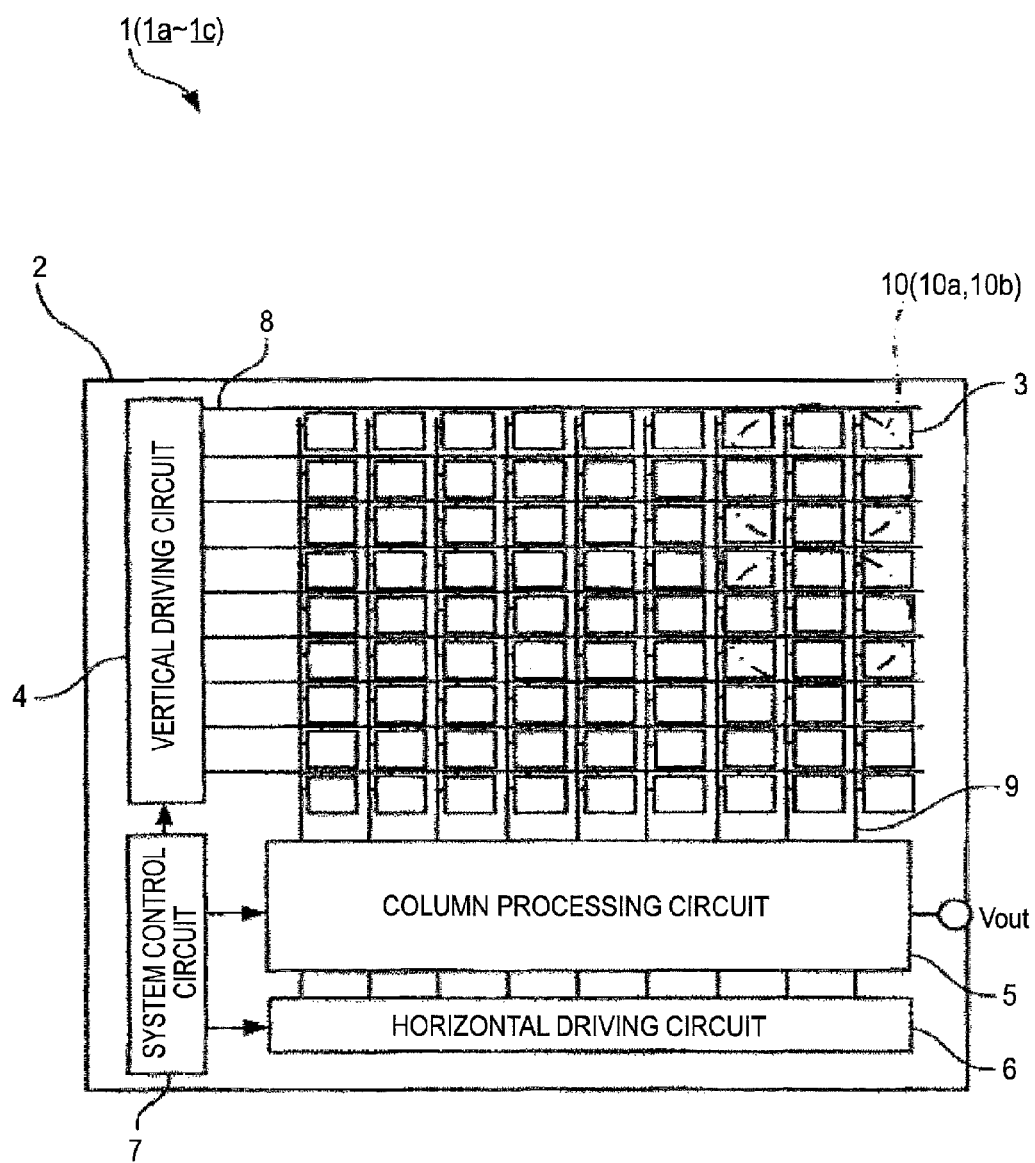

[FIG.2]
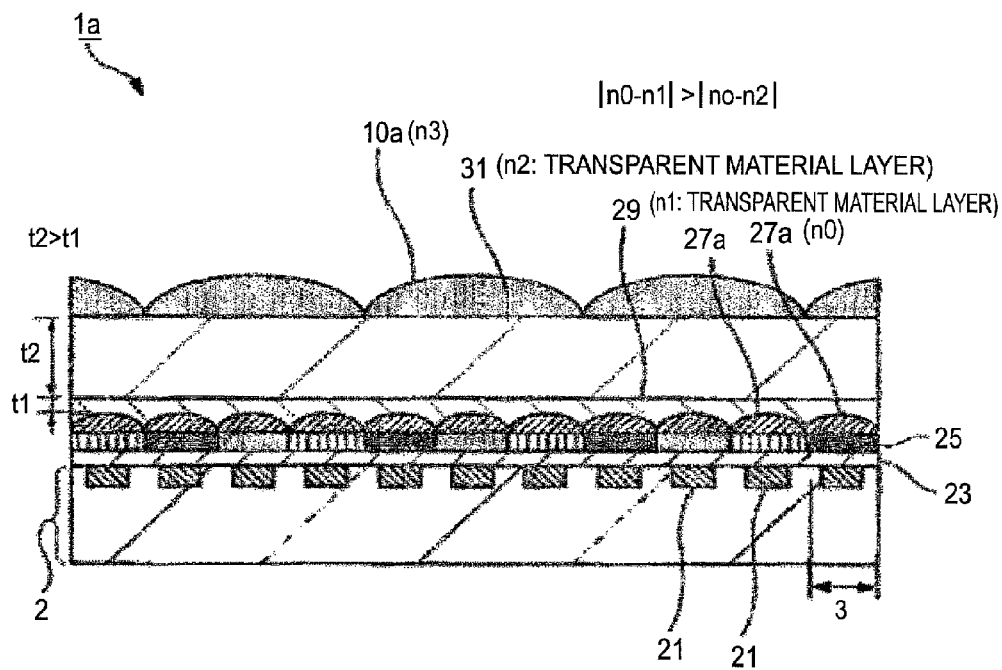
[FIG.3]
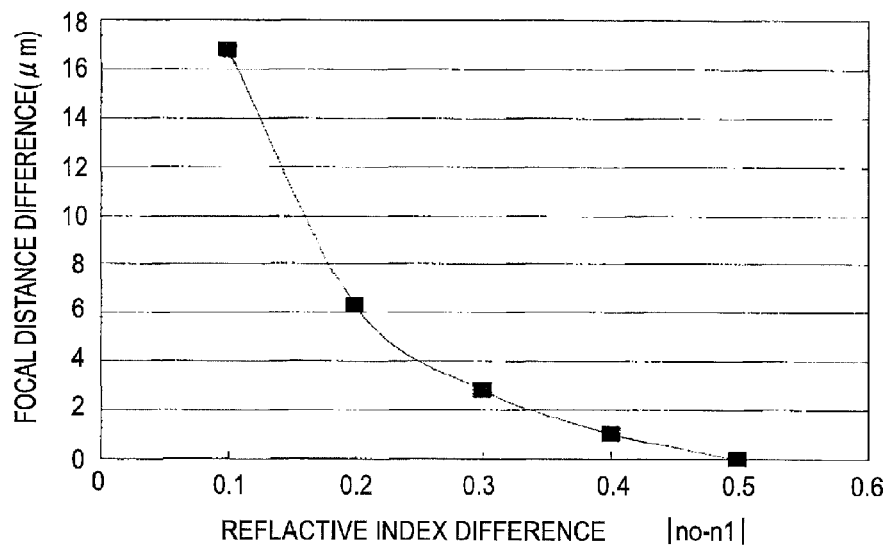

[FIG.4]
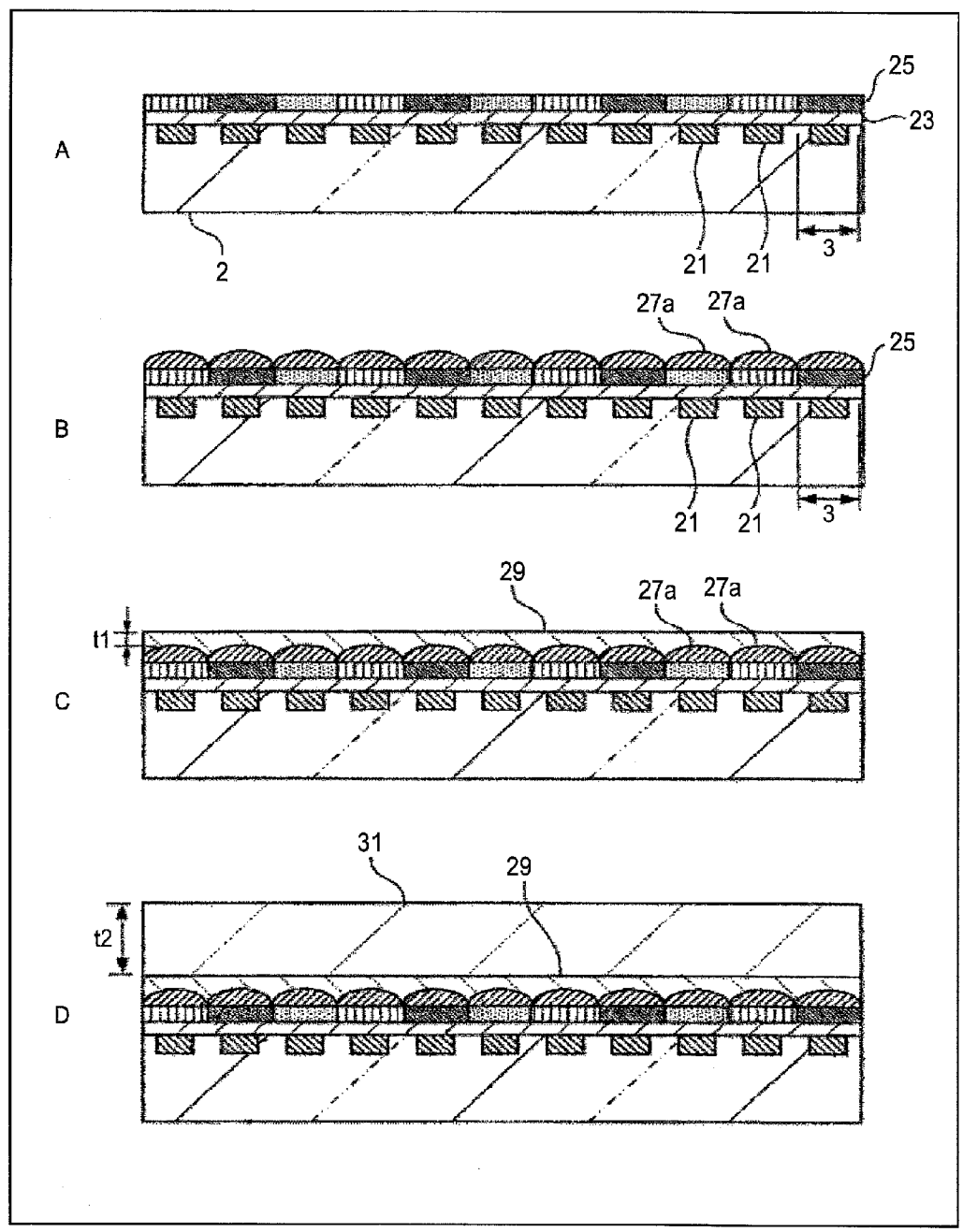

[FIG.5]
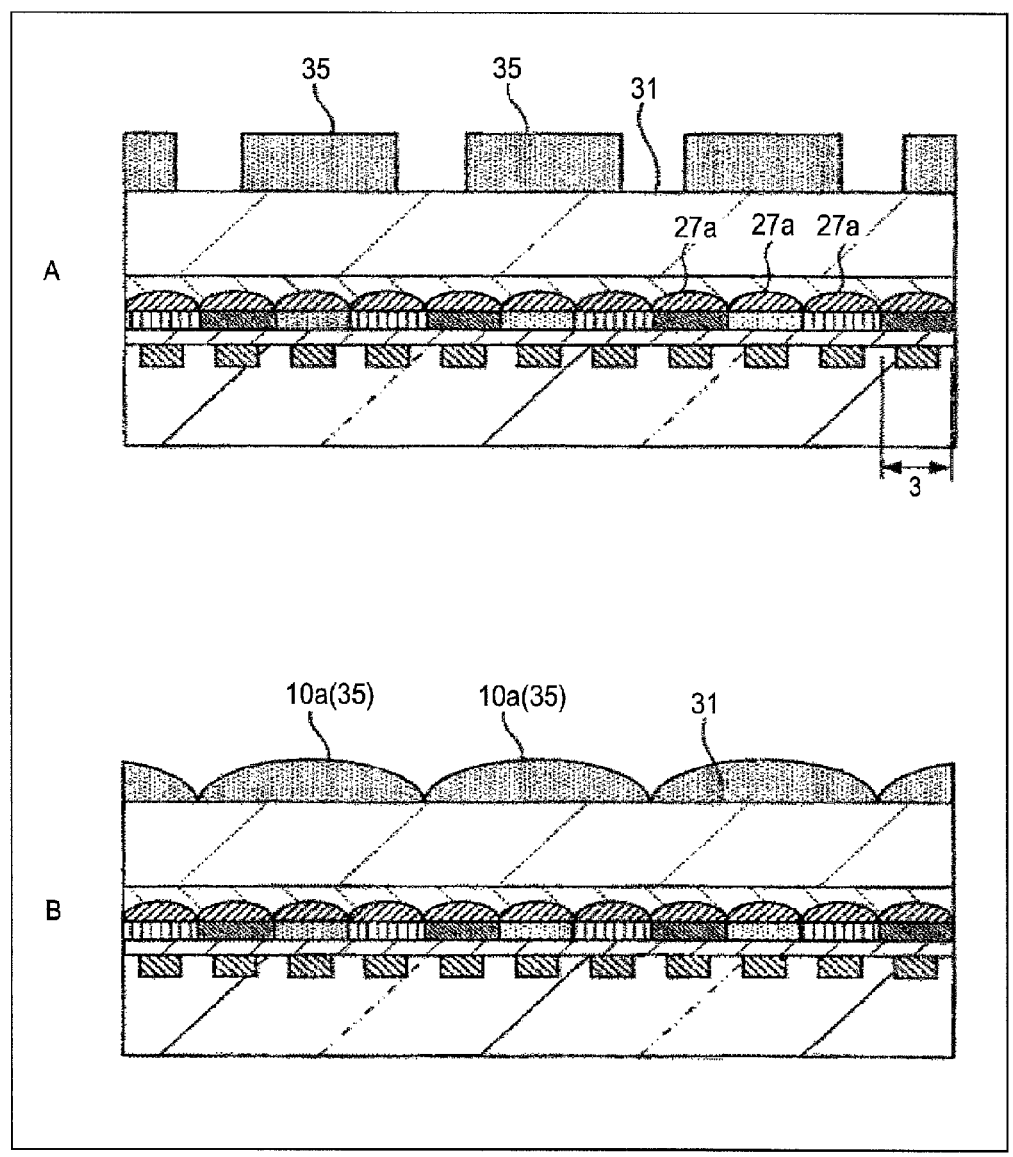

[FIG.6]
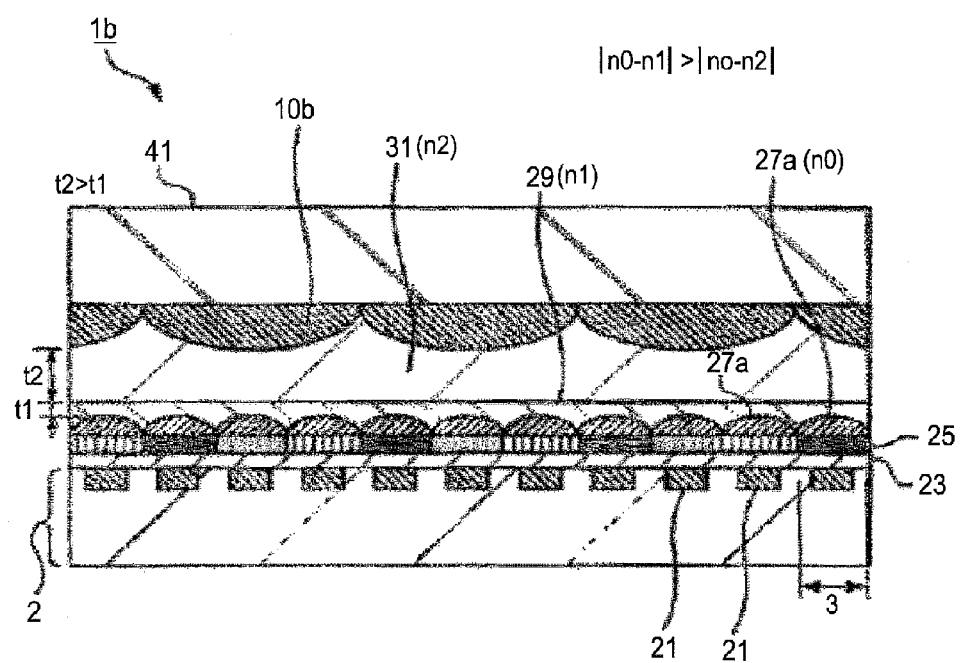

[FIG.7]
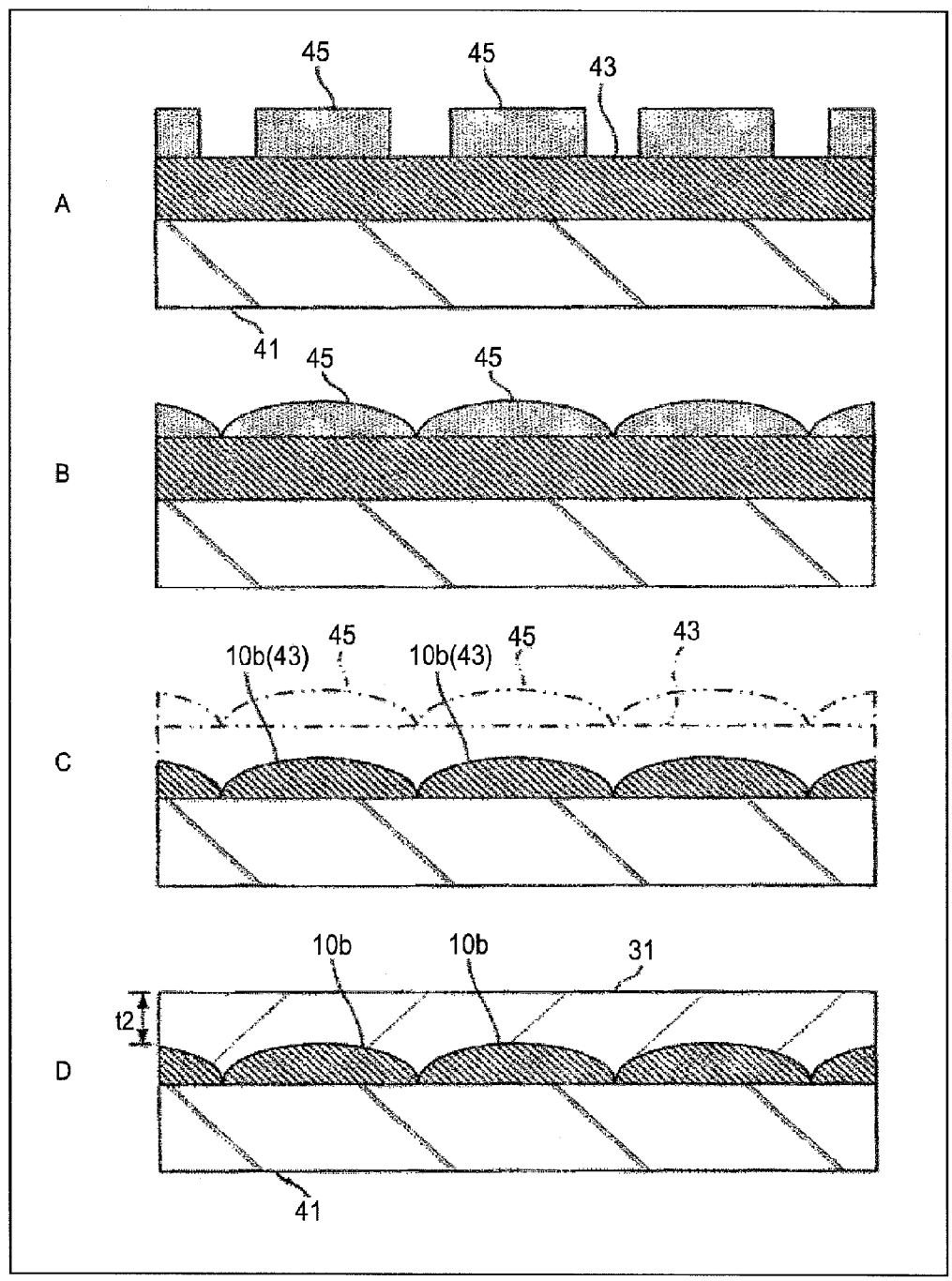

[FIG.8]
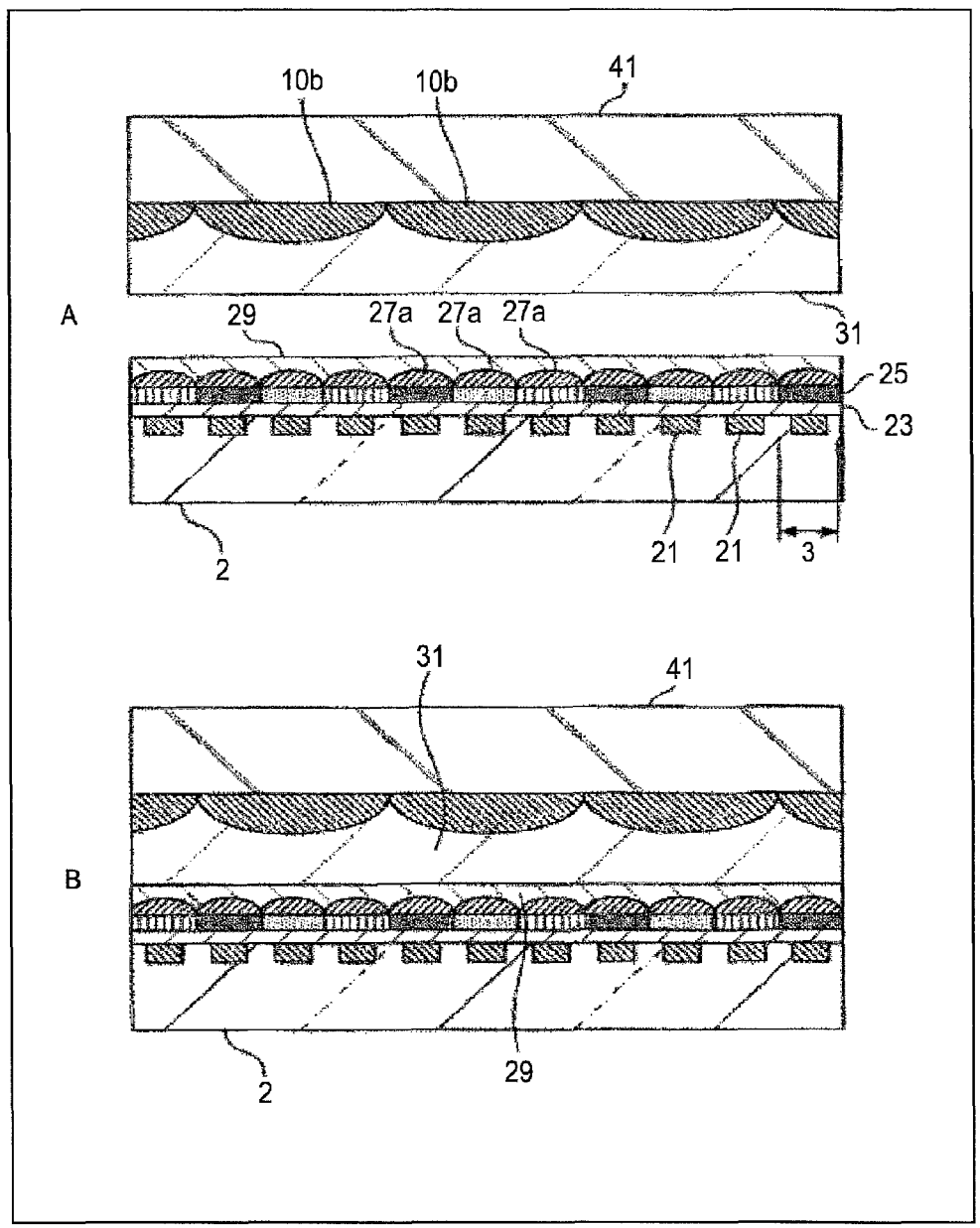

[FIG.9]
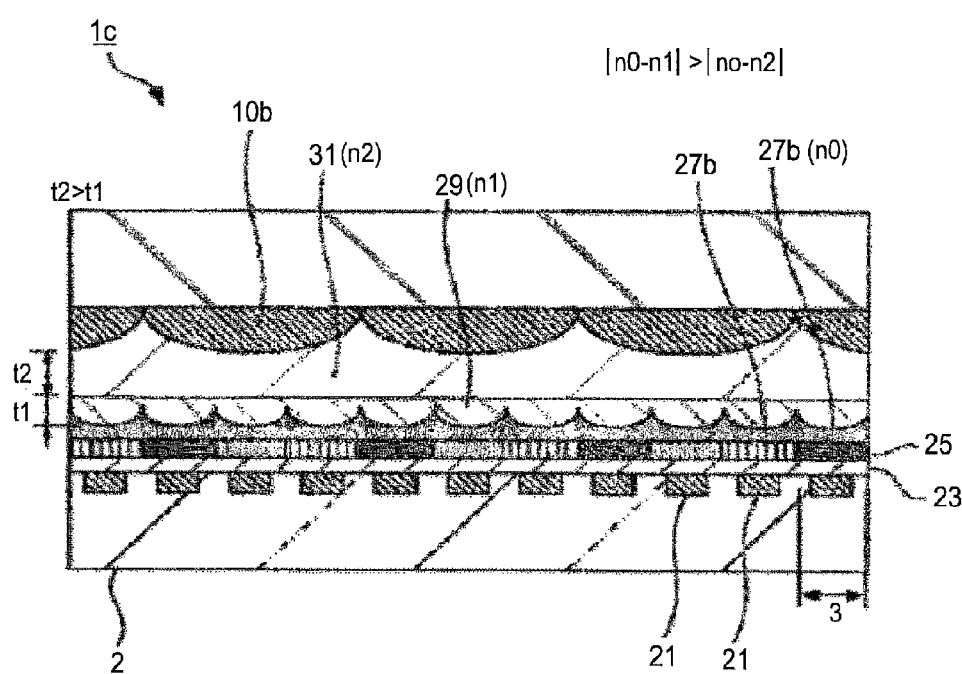

[FIG.10]
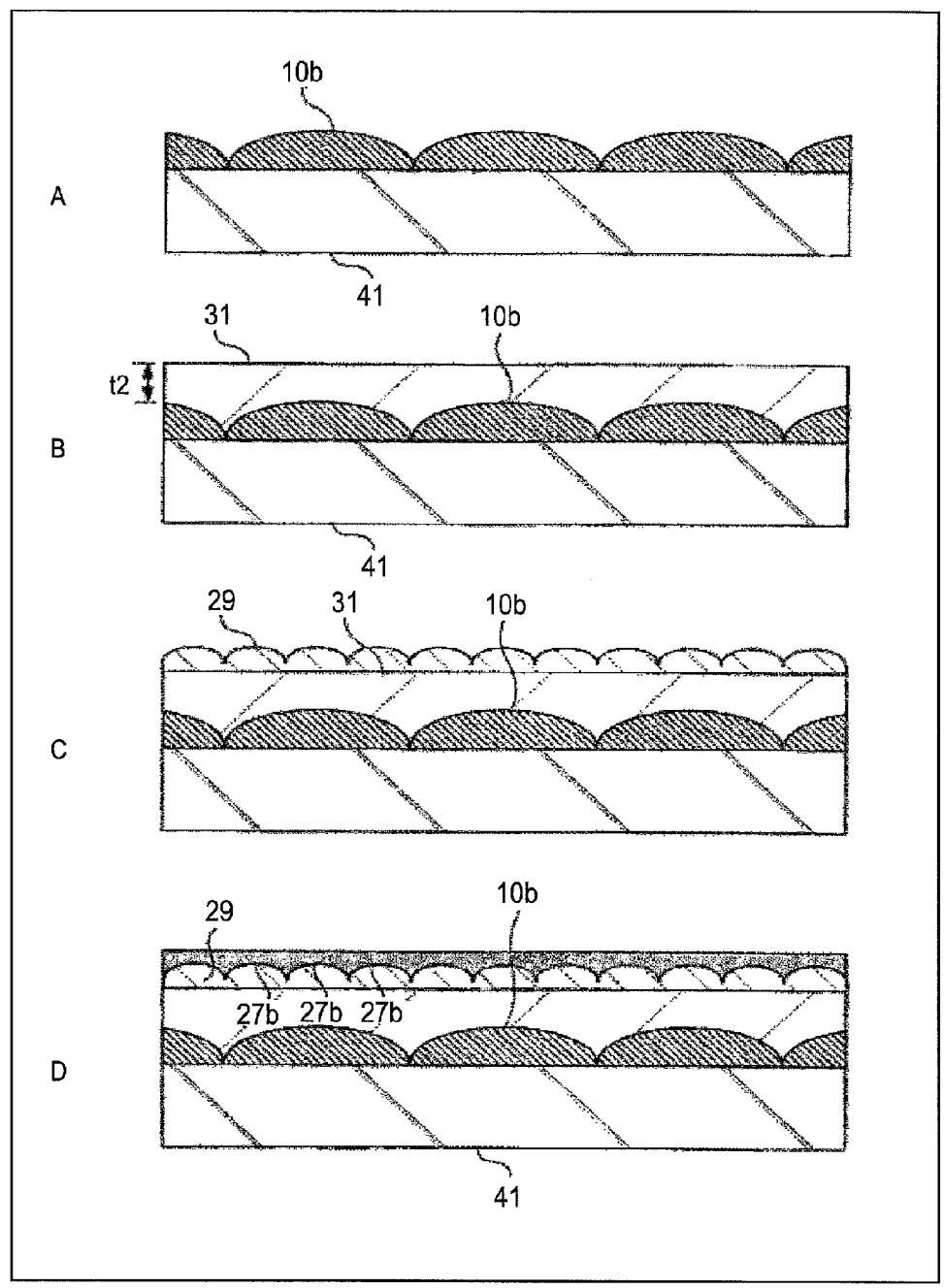

[FIG.11]
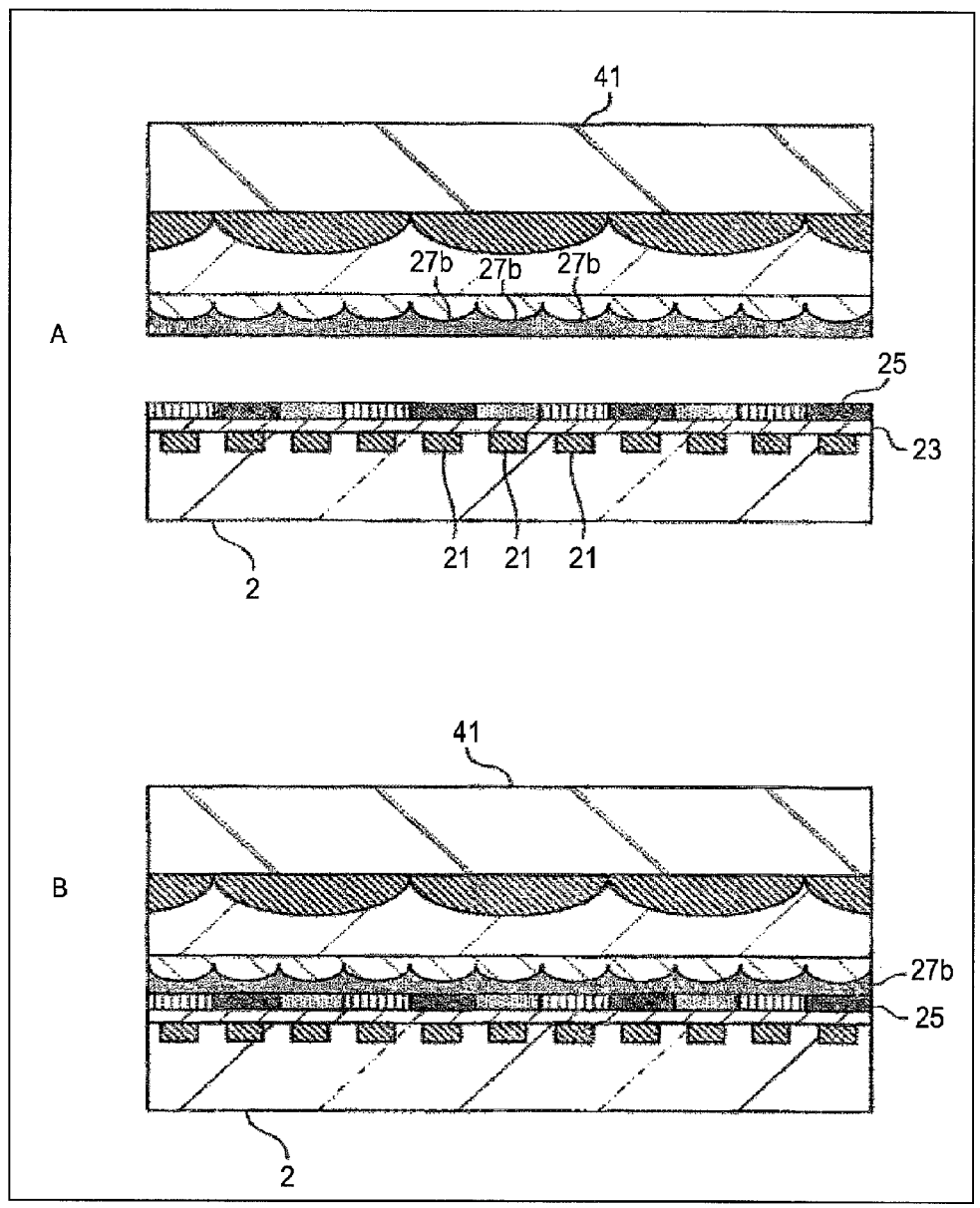

[FIG.12]
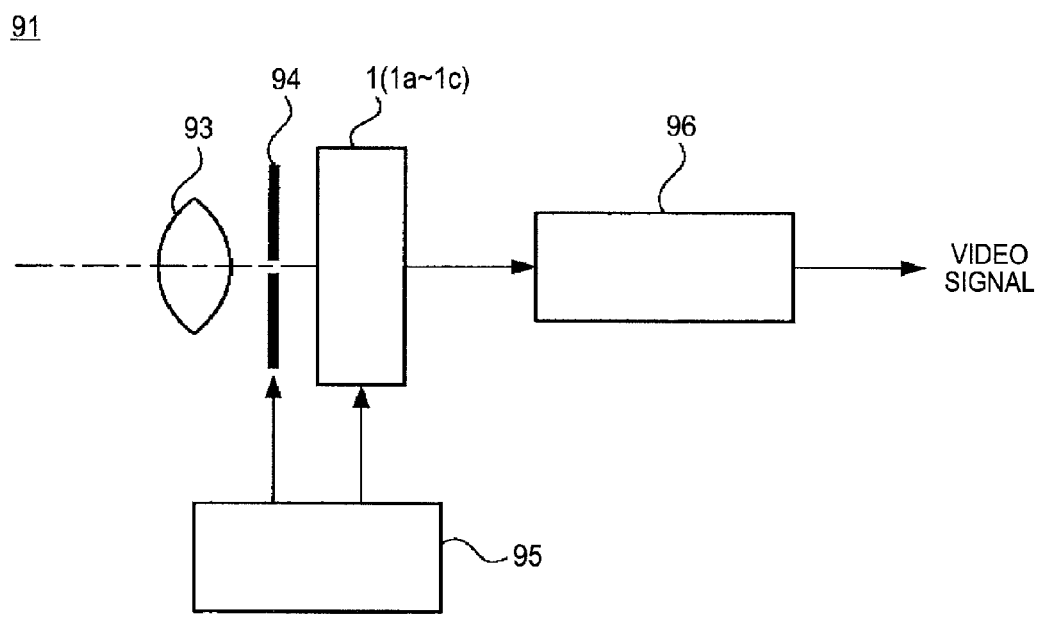

SOLID-STATE IMAGING APPARATUS WITH ON-CHIP LENS AND MICRO-LENS

CROSS-REFERENCE TO RELATED APPLICATIONS/INCORPORATION BY REFERENCE

The present application is a continuation application of U.S. patent application Ser. No. 13/635,262, filed Oct. 4, 2012, which is a National Stage of PCT/JP2012/050837, filed Jan. 17, 2012, and claims the benefit of priority from prior Japanese Patent Application JP 2011-014111, filed Jan. 26, 2011, the entire content of which is hereby incorporated by reference.

TECHNICAL FIELD

The present disclosure relates to a solid-state imaging apparatus, a method of manufacturing a solid-state imaging apparatus, and an electronic apparatus, and more particularly, to a compound-eye system solid-state imaging apparatus in which one micro-lens is arranged so as to face each plurality of on-chip lenses, a method of manufacturing thereof, and an electronic apparatus that uses the solid-state imaging apparatus.

BACKGROUND ART

A solid-state imaging apparatus includes a plurality of photoelectric conversion units that are two-dimensionally arranged on one principal face side of a substrate. On the upper side of each photoelectric conversion unit, an on-chip lens corresponding to the photoelectric conversion unit is arranged. In addition, in recent years, a compound-eye system solid-state imaging apparatus (a so-called light field camera) in which one micro-lens is arranged so as to face each plurality of on-chip lenses arranged, for example, in 2×2, 3×3, or the like is proposed. In a compound-eye system solid-state imaging apparatus, in addition to the intensity distribution of light, information on the traveling direction of the light can be acquired as captured data acquired from the photoelectric conversion unit. Accordingly, by performing predetermined image processing for the acquired captured data, for example, an image (disparity image) in an arbitrary field of view or an image (refocused image) at an arbitrary focus can be generated. Furthermore, the captured data can be applied to a three-dimensional display using a display technique called an integral type.

In such a compound-eye system solid-state imaging apparatus, a micro lenses are disposed with a space interposed therebetween on a substrate on which on-chip lenses are disposed such that the on-chip lenses are arranged on the focal planes of the micro-lenses (for example, see PTL 1 and PTL 2 described below). The space is configured so as to arrange a light shielding block having a plurality of opening portions corresponding to the micro-lenses between, for example, a substrate (imaging unit) on which the on-chip lenses are disposed and a micro-lens array that is acquired by arranging micro-lenses.

CITATION LIST

Patent Literature

[PTL 1] JP-A-2002-171430
[PTL 2] JP-A-2010-67624

SUMMARY OF INVENTION

Technical Problem

However, in the compound-eye system solid-state imaging apparatus having such a configuration, the micro-lens array and the imaging unit are arranged through a space portion. Accordingly, for example, under the use environments having high temperature or high temperature and high humidity, optical axis mismatch or the like occurs due to a difference of thermal expansion coefficients between the micro-lens array and the imaging unit, whereby degradation of the image quality such as shading or uneven image quality occurs.

Thus, an object of the present disclosure is to provide a compound-eye system solid-state imaging apparatus that can suppress degradation of the image quality due to optical axis mismatch between the micro-lens array and the imaging unit and thus can perform imaging with high image quality regardless of the use environments. In addition, another object of the present disclosure is to provide a method of manufacturing the solid-state imaging apparatus and an electronic apparatus that uses the solid-state imaging apparatus.

Solution to Problem

In order to achieve such objects, a solid-state imaging apparatus according to the present disclosure includes: photoelectric conversion units that are two-dimensionally arranged; on-chip lenses that are two-dimensionally arranged on an upper side of the photoelectric conversion units in correspondence with the photoelectric conversion units; and a micro-lens that is arranged so as to face each plurality of the on-chip lenses. More particularly, the solid-state imaging apparatus includes a transparent material layer that is pinched between the on-chip lenses and the micro-lens.

According to the solid-state imaging apparatus having such a configuration, by interposing the transparent material layer between the on-chip lens and the micro-lens, from the photoelectric conversion unit to the micro-lens are integrally configured without a space portion interposed therebetween. Accordingly, even under a high-temperature and high-humidity usage environment, it is difficult for the optical axis mismatch between the on-chip lens and the micro-lens to occur due to a difference in the thermal expansion coefficient.

In addition, the present disclosure is a method of manufacturing a solid-state imaging apparatus as well and includes forming a transparent material layer interposed between the on-chip lens and the micro-lens on a substrate on which the photoelectric conversion units and the on-chip lenses are formed or a substrate on which the micro-lens is formed.

Furthermore, the present disclosure is an electronic apparatus that uses such a solid-state imaging apparatus and includes an optical system that guides incident light to the micro-lens of the solid-state imaging apparatus and a signal processing circuit that processes an output signal output from the photoelectric conversion unit of the solid-state imaging apparatus.

Advantageous Effects of Invention

As described above, according to the present disclosure, it is difficult for the optical axis mismatch to occur due to a difference of the thermal expansion coefficients between the on-chip lens and the micro-lens disposed on the upper side thereof, and accordingly, the image quality of the captured image can be improved in the compound-eye system solid-state imaging apparatus regardless of the use environments.

BRIEF DESCRIPTION OF DRAWINGS

FIG. 1 is a schematic configuration diagram of a main portion of a solid-state imaging apparatus acquired by applying the present disclosure.

FIG. 2 is a cross-sectional view of a main portion of a solid-state imaging apparatus according to a first embodiment.

FIG. 3 is a graph that illustrates the relation between a difference in the refractive indices of an on-chip lens and a first intermediate layer and a focal distance.

FIG. 4 is a manufacturing process diagram (1) of the solid-state imaging apparatus according to the first embodiment.

FIG. 5 is a manufacturing process diagram (2) of the solid-state imaging apparatus according to the first embodiment.

FIG. 6 is a cross-sectional view of a main portion of a solid-state imaging apparatus according to a second embodiment.

FIG. 7 is a manufacturing process diagram (1) of the solid-state imaging apparatus according to the second embodiment.

FIG. 8 is a manufacturing process diagram (2) of the solid-state imaging apparatus according to the second embodiment.

FIG. 9 is a cross-sectional view of a main portion of a solid-state imaging apparatus according to a third embodiment.

FIG. 10 is a manufacturing process diagram (1) of the solid-state imaging apparatus according to the third embodiment.

FIG. 11 is a manufacturing process diagram (2) of the solid-state imaging apparatus according to the third embodiment.

FIG. 12 is a configuration diagram of an electronic apparatus of the present disclosure.

DESCRIPTION OF EMBODIMENTS

Hereinafter, embodiments of the present disclosure will be described in the following order based on the drawings.
1. Schematic Configuration Example of Solid-state Imaging Apparatus of Present Disclosure
2. First Embodiment (Example in Which Convex-Type On-Chip Lens+Convex-Type Micro-Lens Are Used)
3. Second Embodiment (Example in Which Convex-Type On-Chip Lens+Concave-Type Micro-Lens Are Used)
4. Third Embodiment (Example in Which Concave-Type On-Chip Lens+Concave-Type Micro-Lens Are Used)
5. Fourth Embodiment (Embodiment of Electronic Apparatus)

The same reference numeral is assigned to each constituent element that is common to the embodiments and modified examples, and duplicate description will not be presented.

<<1. Schematic Configuration Example of Solid-State Imaging Apparatus >>

FIG. 1 illustrates a schematic configuration of a MOS-type solid-state imaging apparatus as an example of a solid-state imaging apparatus that is manufactured by using a manufacturing method according to each embodiment of the present disclosure.

The solid-state imaging apparatus 1 illustrated in this diagram has a pixel area in which a plurality of pixels 3 including photoelectric conversion units are two-dimensionally arranged regularly on one face of a substrate 2. In each pixel 3, a pixel circuit is disposed, which is configured by a photoelectric conversion unit, an electric charge accumulating unit, a plurality of transistors (so-called MOS transistors), a capacitive device, and the like. In addition, a part of the pixel circuit may be shared by a plurality of pixels.

In the peripheral portion of the above-described pixel area, peripheral circuits such as a vertical driving circuit 4, a column signal processing circuit 5, a horizontal driving circuit 6, and a system control circuit 7 are disposed.

The vertical driving circuit 4, for example, is configured by a shift register, selects a pixel driving line 8, and supplies a pulse that is used for driving pixels to the selected pixel driving line 8, thereby driving pixels 3 arranged in the pixel area in units of rows. In other words, the vertical driving circuit 4 sequentially and selectively scans the pixels 3 arranged in the pixel area in units of rows in the vertical direction. Then, the vertical driving circuit 4 supplies a pixel signal that is based on a signal electric charge generated in accordance with the amount of received light in each pixel 3 to the column signal processing circuit 5 through the vertical signal line 9 that is wired to be vertical to the pixel driving line 8.

The column signal processing circuit 5 is arranged, for example, for each column of the pixels 3 and performs signal processing such as noise elimination for signals output from the pixels 3 corresponding one row for each pixel row. In other words, the column signal processing circuit 5 performs signal processing such as correlated double sampling (CDS) for eliminating a fixed pattern noise that is unique to each pixel, signal amplification, or analog-to-digital (AD) conversion.

The horizontal driving circuit 6 is, for example, configured by a shift register and sequentially selects each column signal processing circuit 5 by sequentially outputting horizontal scanning pulses, and outputs pixel signals from the column signal processing circuits 5.

The system control circuit 7 receives an input clock and data used for instructing an operation mode or the like and outputs data such as internal information of the solid-state imaging apparatus 1. In other words, the system control circuit 7 generates a clock signal that is used as a reference for the operations of the vertical driving circuit 4, the column signal processing circuit 5, the horizontal driving circuit 6, and the like and control signals based on a vertical synchronization signal, a horizontal synchronization signal, and a master clock. Then, the system control circuit 7 inputs such signals to the vertical driving circuit 4, the column signal processing circuit 5, the vertical driving circuit 6, and the like.

A driving circuit that drives each pixel is configured by the peripheral circuits 4 to 7 described above and the pixel circuit disposed in each pixel 3. The peripheral circuits 4 to 7 may be arranged at positions overlapping the pixel area.

In the above-described configuration, by disposing one micro-lens 10 for each plurality of pixels 3, on the upper side of the pixels 3, a compound-eye system solid-state imaging apparatus 1 is configured. Here, an example is illustrated in the diagram in which one micro-lens 10 is disposed for nine pixels 3, for example, arranged in a 3×3 pattern.

<<2. First Embodiment (Example in which Convex-Type on-Chip Lens+Convex-Type Micro-Lens are Used) >>
[Configuration of Solid-State Imaging Apparatus of First Embodiment]

FIG. 2 is a cross-sectional view of a main portion of a solid-state imaging apparatus 1a according to the first embodiment. The solid-state imaging apparatus illustrated in the diagram is a so-called compound-eye system solid-state imaging apparatus (Light Field Camera) and is configured as follows.

In the compound-eye system solid-state imaging apparatus 1a, one principal face side of the substrate 2, for example, formed from single crystal silicon is configured as a light receiving face, and, on a surface layer disposed on the light receiving face side, photoelectric conversion units 21 that are formed from an impurity region are two-dimensionally arranged and formed. The photoelectric conversion unit 21 is disposed for each pixel 3. On the light receiving face of the substrate 2, a color filter layer 25 is disposed through a protective insulating film 23. The color filter layer 25 is configured by color filters of each color that are patterned for each pixel 3.

The configuration described as above may be similar to the configuration of a common solid-state imaging apparatus, and the configuration of each member that is arranged in each pixel 3 is not limited. In other words, the photoelectric conversion unit 21, as illustrated in the diagram, may be disposed only on one principal face side that is the light receiving face side of the substrate 2 or may be disposed from one principal face side so as to extend over the other principal face side. In addition, in the substrate 2, other impurity regions such as element separation or a floating diffusion, which are not illustrated in the diagram, are arranged as necessary. In addition, on the substrate 2 in which the impurity region including the photoelectric conversion units 21 is disposed, a gate insulating film, a gate electrode, and the like, which are not illustrated in the figure, may be arranged. In such a case, the protective insulating film 23 is arranged in the state covering the gate insulating film or the gate electrode. In addition, the pixel circuit that includes the gate insulating film and the gate electrode may be arranged on a side opposite to the light receiving face of the substrate 2.

On such a color filter layer 25, layers that correspond to features of the present disclosure are disposed. In other words, on the color filter layer 25, (A) an on-chip lens 27a, (B) a first intermediate layer 29, (C) a second intermediate layer 31, and (D) a micro-lens 10a are disposed in this order. Hereinafter, a detailed configuration will be described in order from the substrate 2 side.

(A) The on-chip lens 27a is arranged in correspondence with each pixel 3 and each photoelectric conversion unit 21. Here, for example, the on-chip lens 27a is assumed to be a convex-type lens that is convex in the light incidence direction. Such an on-chip lens 27a is configured by a material (hereinafter, referred to as a transparent material) having transparency for light of a wavelength that is photoelectrically converted by the photoelectric conversion unit 21 and is composed using a material having a refractive index n0. In addition, while a plurality of on-chip lenses may be stacked on each photoelectric conversion unit 21, the on-chip lens 27a described here is assumed to be an on-chip lens arranged on the uppermost layer.

Here, as the material that composes the on-chip lens 27a, it is preferable that, as will be described in relation to a first intermediate layer 29, a material having a refractive index that is greatly different from the refractive index of the first intermediate layer 29 is used. Especially, the on-chip lens 27a here is a convex-type lens, and accordingly, a material having a high refractive index among transparent materials is used. Here, as an example, the on-chip lens 27a is composed by using silicon nitride (a refractive index n0=1.9). In addition, as materials composing such a convex-type on-chip lens 27a, other than silicon nitride, there are silicon oxide nitride (refractive index n0=1.85), a titanium oxide dispersed polysiloxane resin (refractive index n0=1.8), a titanium oxide-dispersed acrylic resin (refractive index n0=1.8), and the like. In addition, the refractive index n0 and a refractive index to be represented below are refractive indices for a wavelength $\lambda=550$ nm near the center of visible light as imaging wavelength.

(B) The first intermediate layer 29 is a layer that is disposed as a transparent material layer and allows the lens shape of the on-chip lens 27a to be embedded therein so as to be formed to be flat. It is important that the first intermediate layer 29 is composed of a material of which the refractive index n1 is sufficiently different from the refractive index n0 of the on-chip lens 27a to some degree for which the characteristics of condensing light to the photoelectric conversion unit 21 using the on-chip lens 27a can be maintained. Here, since the on-chip lens 27a is a convex-type lens, the first intermediate layer 29 is formed by using a material having a low refractive index out of transparent materials, and the refractive index n0 of the on-chip lens 27a and the refractive index n1 of the first intermediate layer 29 satisfy the relation of "n1<n0". In addition, the first intermediate layer 29 may have a film thickness of a level for which the lens shape of the on-chip lens 27a is embedded therein so as to be formed to be flat, and the focal distance of the micro-lens 10a to be described later does not need to be considered.

In the following Table 1, a refractive index difference a ($|n0-n1|$) between the refractive index n0 of the on-chip lens 27a and the refractive index n1 of the first intermediate layer 29 and a focal distance b of the on-chip lens 27a are represented. In addition, a focal distance difference c is represented in a case where the focal distance of the on-chip lens 27a is set as a reference value=0 in a case where the first intermediate layer 29 is substituted with the air (refractive index n=1.0). Furthermore, FIG. 3 is a graph that illustrates the relation between the above-described refractive index difference a and the focal distance difference c. In addition, the on-chip lens 27a is composed by using silicon nitride (refractive index n0=1.9) and is formed by applying a pixel size of 1.4 µm, and the graph is a graph that is acquired while changing the refractive index n1 of the first intermediate layer 29.

TABLE 1

| Refractive Index Difference a $|n0 - n1|$ | Focal Distance b (µm) | Focal Distance Difference c (µm) |
| --- | --- | --- |
| 0.1 | 23.1 | 16.8 |
| 0.2 | 12.6 | 6.3 |
| 0.3 | 9.1 | 2.8 |
| 0.4 | 7.4 | 1.1 |
| 0.5 | 6.3 | 0 (first intermediate layer is the air) |

As illustrated in Table 1 and the graph described above, the focal distance of each on-chip lens 27a increases as a refractive index difference between the on-chip lens 27a and the first intermediate layer 29 arranged to be adjacent thereto in the incidence direction of light decreases. When the focal distance of the on-chip lens 27a is long, a distance between the on-chip lens 27a and the photoelectric conversion unit 21 needs to increase, whereby the degradation of inclined light incidence sensitivity and the like are assumed. Accordingly, the on-chip lens 27a is required to have a short focal distance of a level that is the same as that of case where the first intermediate layer 29 is substituted with the air, and the material composing the first intermediate layer 29 is selected such that the refractive index difference |n0−n1|≥0.4. More preferably, the focal distance of the on-chip lens 27a is smaller than the size of the pixel 3.

When the material composing the above-described first intermediate layer 29 is selected, an increase in the film thickness t1 of the first intermediate layer 29 does not need to be considered. More specifically, in a case where the on-chip lens 27a is composed by using silicon nitride (refractive index n0=1.9), it is preferable that a material having a refractive index n1=1.5 or less is used as the material of the first intermediate layer 29. As examples of such a material, there are a fluorine-containing polysiloxane resin (refractive index n1=1.42), a fluorine-containing acrylic resin (refractive index n1=1.42), and a hollow silica particle containing polysiloxane resin (refractive index n1=1.35).

(C) A second intermediate layer 31 is a layer that is disposed as a transparent material layer, and the surface thereof is formed to be flat. It is important that the second intermediate layer 31 has a film thickness t2 of a level for which the characteristics of condensing light to the on-chip lens 27a using the micro-lens 10a can be maintained. Accordingly, the film thickness t2 of the second intermediate layer 31 and the film thickness t1 of the first intermediate layer 29 have the relation of "t2>t1".

For example, in a case where one micro-lens 10a is arranged in correspondence with 3×3 pixels, the pixel size is 1.4 μm, and the micro-lens 10a has a hemisphere lens shape having a shortest focal distance, the focal distance of the micro-lens 10a is [1.5×(1.4 μm×3/2)/(1.5−1)]=6.3 μm. Accordingly, the film thickness t2 of the second intermediate layer 31 is set to a value acquired by withdrawing the film thickness t1 of the first intermediate layer 29 from the focal distance 6.3 μm of the micro-lens 10a. However, in a case where the micro-lens 10a is formed, for example, by using a melt flow method, it is difficult to form the micro-lens 10a having a volume larger that the on-chip lens 27a to have large curvature that is close to a hemisphere. Accordingly, the focal distance of the micro-lens 10a tends to further increase. Therefore, in the previous example, the film thickness t2 of the second intermediate layer 31 is set to be further larger than the value acquired by withdrawing the film thickness t1 of the first intermediate layer 29 from the focal distance 6.3 μm of the micro-lens 10a that is assumed to be a hemisphere.

For the refractive index n0 of the on-chip lens 27a and the refractive index n1 of the first intermediate layer 29, the refractive index n2 of the material that composes the second intermediate layer 31 may have the relation of |n0−n1|>|n0−n2|. In addition, from the viewpoint of preventing reflection of light on the interface between the first intermediate layer 29 and the second intermediate layer 31, it is preferable that refractive index n1≅refractive index n2.

As examples of the material that composes the second intermediate layer 31 described as above, there are an acrylic resin (refractive index n2=1.5), a polysiloxane resin (refractive index n2=1.5), and a polystyrene resin (refractive index n2=1.6). In a case where such a material is used, for example, with ethyl lactate used as a solvent, the material can be dissolved in a large quantity into the solvent. Accordingly, high-viscosity coating solution can be formed at the time of forming a film and can be used for thick-film coating.

(D) The micro-lens 10a is arranged for each plurality of on-chip lenses 27a, and here, one micro-lens 10a is arranged, for example, for each on-chip lenses 27a of nine pixels that are two-dimensionally arranged in a 3×3 pattern. Such a micro-lens 10a, for example, is a convex-type lens that is convex in the light incidence direction and is composed of a transparent material having a refractive index n3 that has a sufficient difference from the refractive index (n=1) of the air. Here, since the micro-lens 10a is a convex lens, a material having a refractive index n3 that is higher than the refractive index (n=1) of the air is used.

In addition, as a material that composes the micro-lens 10a that is larger than the on-chip lens 27a as above, a material that is selected in consideration of the processibility as well is used. As an example of such a material, there is an inorganic glass-based material such as a polyhydroxystyrene-based resist material (refractive index n3=1.5), silicon nitride (refractive index n3=1.9), or an acrylic-based resist material (refractive index n3=1.5) or an organic transparent resin material-based material. As a material having a higher refractive index n3 is used as the micro-lens 10a, the film thickness t2 of the second intermediate layer 31 further decreases.

[Method of Manufacturing Solid-State Imaging Apparatus of First Embodiment]

FIGS. 4 and 5 are cross-sectional process diagrams that illustrate a manufacturing procedure of the solid-state imaging apparatus according to the first embodiment. Hereinafter, a method of manufacturing a solid-state imaging apparatus according to the first embodiment illustrated in FIG. 2 will be described in accordance with the diagrams.

[A of FIG. 4]

First, as illustrated in A of FIG. 4, for example, a photoelectric conversion unit 21, which is formed from an impurity region through ion injection from the upper side of a mask and a heat treatment performed thereafter, is formed in each pixel 3 disposed on one principal face side of a substrate 2, for example, formed from single crystal silicon. In addition, another impurity region is formed inside the substrate 2 as is necessary, and gate insulating films and gate electrodes are further formed on the substrate 2. Thereafter, a protective insulating film 23 is formed as a film on the substrate 2. At this time, the protective insulating film 23 is formed to have a film thickness that is adjusted such that the focal point of the on-chip lens is positioned within the photoelectric conversion unit 21 in consideration of the focal distance of the on-chip lens that is formed thereafter. Thereafter, a color filter of each color is patterned and formed in each pixel 3 on the upper part of the protective insulating film 23. Accordingly, a color filter layer 25 is formed on the protective insulating film 23.

[B of FIG. 4]

Next, as illustrated in B of FIG. 4, an on-chip lens 27a is formed on the color filter layer 25. Here, as described above, the on-chip lens 27a that is formed from silicon nitride (refractive index n0=1.9) is formed. At this time, first, a silicon nitride film is formed as a film on the color filter layer 25, and a resist pattern having an independent island shape is formed in correspondence with each pixel portion located on the upper side thereof. Next, by performing a heat treatment using a melt flow method, the resist pattern is allowed to flow so as to be shaped in a convex form in accordance with the surface tension. Thereafter, the silicon nitride film is etched together with the resist pattern from the upper side of the resist pattern having a convex-type lens shape, whereby the curved shape of the resist pattern is transferred to the silicon nitride film. Accordingly, the convex-type on-chip lens 27a that is formed from silicon nitride is formed on each photoelectric conversion unit 21.
[C of FIG. 4]

Thereafter, as illustrated in C of FIG. 4, a first intermediate layer 29 is formed as a film in a state in which the lens shape of the on-chip lens 27a is embedded. Here, a transparent material that has a sufficient difference from the refractive index of silicon nitride that composes the on-chip lens 27a is used. As such a material, here, a fluorine-containing polysiloxane resin (refractive index n1=1.42) is used, and the first intermediate layer 29 is formed as a film by using a spin coat method. At this time, first, the upper side of the on-chip lens 27a is spin-coated with a solution in which a fluorine-containing polysiloxane resin is dissolved in Propylene Glycol Mono Methyl Ether Acetate (PEGMEA) as a solvent. At this time, the saturated solubility of the fluorine-containing polysiloxane resin with respect to PEGMEA is low, and the solution has extremely low viscosity. Accordingly, there is a limitation on the coated film thickness of the solution by performing spin coat on the on-chip lens 27a. However, here, coating may be performed using the solution such that the lens shape of the on-chip lens 27a is embedded so as to flatten the surface, and the coating film thickness is not required to be large, and, for example, coating using the solution is performed with a coating film thickness of about 1 μm from the top of the on-chip lens 27a. In addition, according to the spin coat method using a solution having low saturated solubility, the solution has very low viscosity, and accordingly, the embedding of the on-chip lens 27a is excellent, whereby excellent image quality in which an image defect due to a void is small can be provided.

Thereafter, by performing a heat treatment, for example, at 120° C. for one minute, the solvent contained in the solution with which the upper side of the on-chip lens 27a is coated is dried so as to be removed, and, by continuously performing a heat treatment at 230° C. for five minutes, the fluorine-containing polysiloxane resin is sufficiently cured. Accordingly, the first intermediate layer 29 formed from a fluorine-containing polysiloxane resin is formed, in which the lens shape of the on-chip lens 27a is embedded so as to be shaped to be flat on the surface. The first intermediate layer 29 has a film thickness t1 of 1 μm or less from the top of the on-chip lens 27a.
[D of FIG. 4]

Next, as illustrated in D of FIG. 4, a second intermediate layer 31 is formed as a film on the first intermediate layer 29. Here, the second intermediate layer 31 is formed as a film using a transparent material that can be formed as a film that is thick to some degree. By using acrylic resin (refractive index n2=1.50) here as the material, and the second intermediate layer 31 is formed as a film by using the spin coat method. At this time, first, spin coat of a solution in which an acrylic resin is dissolved into PEGMEA as a solvent is performed on the upper side of the first intermediate layer 29. At this time, the saturated solubility of the acrylic resin with respect to PEGMEA is higher than the fluorine-containing polysiloxane resin, and the solution has high viscosity. Accordingly, the coated film thickness of the solution can be large by performing spin coat. Here, for example coating is performed using the solution, for example, so as to have a coated film thickness of about 6.0 μm in accordance with the film thickness that is necessary to the second intermediate layer 31.

Thereafter, by performing a heat treatment, for example, at 120° C. for one minute, the solvent contained in the solution is dried so as to be removed, and, by continuously performing a heat treatment at 230° C. for five minutes, the acrylic resin is sufficiently cured. Accordingly, the second intermediate layer 31 of which the film thickness is large as being about t2=6 μm is formed as a film on the first intermediate layer 29.

In addition, the formation of the second intermediate layer 31 is not limited to the application of the spin coat method, and another coating method such as a printing method or a resin sheet bonding method that will be described in the next second embodiment may be used.
[A of FIG. 5]

Next, as illustrated A of FIG. 5, a resist pattern 35 is formed on the second intermediate layer 31 by using a lithography method. This resist pattern 35 is formed in correspondence with the above-described positions at which the micro-lenses are formed and is formed in an independent island shape in correspondence with nine on-chip lenses 27a, for example, that are two dimensionally arranged in a 3×3 pattern. As the material of the resist, a resist material (refractive index n3=1.6) of a novolac resin system is used, and, first, the upper side of the second intermediate layer 31 is coated with an uncured resist material in accordance with a spin coat method so as to be formed as a film having a film thickness of about 1.5 μm. Thereafter, by performing a heat treatment at 120° C. for one minute, a solvent contained in the resist film that is formed as a film through coating is dried so as to be removed. Next, pattern exposure is performed for the resist film using an i-line exposure device. Thereafter, by performing a developing process for the resist film of which the pattern is exposed using an aqueous solution of 2.38 wt % Tetramethylammonium hydroxide (TMAH), a resist pattern 35 is formed on the second intermediate layer 31.
[B of FIG. 5]

Next, as illustrated in B of FIG. 5, a post-exposure baking process for a melt flow and curing is performed. Here, for example, by performing a heat treatment at 200° C. for five minutes, the resist pattern 35 is allowed to flow and is shaped in a curved shape having a convex shape due to surface tension, and the shaped resist pattern 35 is cured. Accordingly, a micro-lens 10a acquired by shaping the resist pattern 35 in a lens shape is formed.

As above, the solid-state imaging apparatus 1a according to the first embodiment described with reference to FIG. 2 is acquired. In addition, in a case where micro-lens 10a is formed from an inorganic material such as silicon nitride, a method of forming a micro-lens described in the following second embodiment may be used.

[Advantages of First Embodiment]

According to the above-described first embodiment, the transparent material layer that is formed from the first intermediate layer 29 and the second intermediate layer 31 is interposed between the on-chip lens 27a and the micro-lens 10a that is arranged in correspondence with a plurality of on-chip lenses 27a in the upper part thereof. Accordingly, from the photoelectric conversion unit 21 under the on-chip lens 27a to the micro-lens 10a are integrally configured without a space portion interposed therebetween. Accordingly, even under a high-temperature and high humidity usage environment, it is difficult for the optical axis mismatch between the on-chip lens 27a and the micro-lens 10a to occur due to a difference in the thermal expansion coefficient. As a result, the image quality of an image captured by the compound-eye system solid-state imaging apparatus can be improved regardless of the use environment. In addition, since this solid-state imaging apparatus $1a$ has an integrated structure without having a space portion interposed therebetween, an image quality having superior sensitivity characteristics and reduced flare ghost can be provided.

In addition, in the first embodiment, the transparent material layer that is interposed between the on-chip lens $27a$ and the micro-lens $10a$ is configured to have a structure in which the first intermediate layer 29 disposed on the on-chip lens $27a$ side and the second intermediate layer 31 disposed on the micro-lens $10a$ side are stacked. Accordingly, the second intermediate layer 31 can be configured by using a material that can implement a thick film in accordance with the focal distance of the micro-lens $10a$ having a large diameter, and the first intermediate layer 29 can be configured by using a material having a refractive index that is in consideration of only the light condensing capability of the on-chip lens $27a$.

As a result, in the compound-eye system solid-state imaging apparatus $1a$, while the focal distance of the micro-lens $10a$ having a large diameter is secured, a distance between the on-chip lens $27a$ and the photoelectric conversion unit 21 decreases, whereby a decrease in the sensitivity due to penetration of inclined incidence light from adjacent pixels 3 can be prevented.

<<3. Second Embodiment (Example in which Convex-Type on-Chip Lens+Concave-Type Micro-Lens are Used) >>
[Configuration of Solid-State Imaging Apparatus of Second Embodiment]

FIG. 6 is a cross-sectional view of a main portion of a solid-state imaging apparatus $1b$ according to the second embodiment. A difference between the compound-eye system solid-state imaging apparatus shown in the diagram and the solid-state imaging apparatus according to the first embodiment is that a micro-lens $10b$ is configured as a concave type in the compound-eye system solid-state imaging apparatus, and the other configurations are similar to those of the solid-state imaging apparatus according to the first embodiment.

In other words, in the compound-eye system solid-state imaging apparatus $1b$, (A) an on-chip lens $27a$, (B) a first intermediate layer 29, (C) a second intermediate layer 31, and (D) a micro-lens $10b$ are disposed in this order on a photoelectric conversion unit 21 through a protective insulating film 23 and a color filter layer 25. Among these, (A) the on-chip lens $27a$, (B) the first intermediate layer 29, and (C) the second intermediate layer 31 have the same configurations as those of the first embodiment. The configuration of (D) the micro-lens $10b$ is as follows.

(D) The micro-lens $10b$ is a concave-type lens that is concave in the light incidence direction and is convex to the second intermediate layer 31 side. Such a micro-lens $10b$ is composed of a transparent material having a refractive index $n3$ that has a sufficient difference from the refractive index $n2$ of the second intermediate layer 31. Especially, here, since the micro-lens $10b$ is a concave-type lens, a material having a refractive index $n3$ that is higher than the refractive index $n2$ of the second intermediate layer 31 is used. Accordingly, the refractive index $n2$ of the second intermediate layer 31 and the refractive index $n3$ of the micro-lens $10b$ have the relation of "$n2<n3$".

In addition, the micro-lens $10b$ is arranged for each plurality of on-chip lenses $27a$, which is similar to the first embodiment. Here, one micro-lens $10b$ is arranged, for example, for each on-chip lenses $27a$ of nine pixels that are two-dimensionally arranged in a 3×3 pattern.

As above, as a material that has a large difference from the refractive index of the second intermediate layer 31 and composes the micro-lens $10b$ having a size larger than the on-chip lens $27a$, a material selected in consideration of the processibility as well is used. Here, the second intermediate layer 31 is composed of an acrylic resin (refractive index $n2=1.5$), a polysiloxane resin (refractive index $n2=1.5$), a polystyrene resin (refractive index $n2=1.6$), or the like. In such a case, as examples of a material that composes the micro-lens $10b$, there are silicon nitride (refractive index $n3=1.9$), silicon oxide nitride (refractive index $n3=1.85$), and the like.

Accordingly, for the refractive index $n0$ of the on-chip lens $27a$ and the first intermediate layer 29, the refractive index $n2$ of the material that composes the second intermediate layer 31 may have the relation of $|n0-n1|>|n0-n2|$. In addition, from the viewpoint of preventing reflection of light on the interface between the first intermediate layer 29 and the second intermediate layer 31, it is preferable that refractive index $n1 \approx$ refractive index $n2$, which is the same as the first embodiment. Furthermore, the film thickness $t2$ of the second intermediate layer 31 and the film thickness $t1$ of the first intermediate layer 29 have the relation of "$t2>t1$".

In addition, on the upper portion of the micro-lens $10b$, a transparent substrate 41 used in a manufacturing process described hereinafter may be disposed.

[Method of Manufacturing Solid-State Imaging Apparatus of Second Embodiment]

FIGS. 7 and 8 are cross-sectional process diagrams that illustrate a manufacturing procedure of the solid-state imaging apparatus according to the second embodiment. Hereinafter, a method of manufacturing the solid-state imaging apparatus according to the second embodiment illustrated in FIG. 6 will be described in accordance with the diagrams.

[A of FIG. 7]

First, as illustrated in A of FIG. 7, a lens material film 43 used for forming a micro-lens is formed on a transparent substrate 41 that is formed from a glass material or a plastic material. Here, for example, by using a plasma chemical vapor deposition (CVD) method, the lens material film 43 that is formed from silicon nitride is formed. At this time, as an example, the lens material film 43 formed from silicon nitride is formed by using a mixed gas type of silane ($SiH_4$), ammonia ($NH_3$), and nitrogen ($N_2$) as film forming gas under the conditions of an ambient temperature of 400° C. and RF power of 800 W.

Next, a resist pattern 45 is formed on the lens material film 43 by using a lithography method. This resist pattern 45 is formed in correspondence with the above-described positions at which the micro-lenses are formed and is formed in an independent island shape in correspondence with nine on-chip lenses $27a$, for example, that are two dimensionally arranged in a 3×3 pattern. A method of forming such a resist pattern 45 is the same as the method of forming the resist pattern described in the first embodiment and is performed as follows.

As the material of the resist, for example, a resist material of a novolac resin system is used, and, first, the upper side of the lens material film 43 is coated with an uncured resist material in accordance with a spin coat method so as to be formed as a film having a film thickness of about 0.5 μm. Thereafter, by performing a heat treatment at 120° C. for one minute, a solvent contained in the resist film that is formed as a film through coating is dried so as to be removed. Next, pattern exposure is performed for the resist film using an i-line exposure device. Thereafter, by performing a developing process for the resist film of which the pattern is exposed using an aqueous solution of 2.38 wt % Tetramethylammonium hydroxide (TMAH), a resist pattern 45 is formed on the lens material film 43.
[B of FIG. 7]

Next, as illustrated in B of FIG. 7, the resist pattern 45 is shaped in a lens shape by using a melt flow method. At this time, for example, by performing a heat treatment at 200° C. for five minutes, the resist pattern 45 is allowed to flow and is shaped in a curved shape having a convex shape due to surface tension, and the shaped resist pattern 45 is cured. Accordingly, the resist pattern 45 is shaped in the lens shape.
[C of FIG. 7]

Next, as illustrated in C of FIG. 7, the lens material film 43 that is formed from silicon nitride is etched together with the resist pattern 45 from the upper portion of the resist pattern 45 shaped in the lens shape. At this time, as etching gas, mixed gas of tetrafluoromethane ($CF_4$)/oxygen ($O_2$) is used, and dry etching is performed with bias power set to 150 W and source power set to 1000 W. Accordingly, the curved shape of the resist pattern 45 is transferred to the lens material film 43, whereby a micro-lens 10*b* that is configured by the lens material film 43 is formed.
[D of FIG. 7]

Thereafter, as illustrated in D of FIG. 7, a second intermediate layer 31 is formed on the transparent substrate 41 on which the micro-lenses 10*b* are formed. This second intermediate layer 31 is formed to have a film thickness t2 together with a first intermediate layer formed next in consideration of the focal distance of the micro-lens 10*b*. Here, the second intermediate layer 31 is bonded to the upper port of the micro-lens 10*b*, for example, though vacuum lamination using a resin sheet. At this time, after the bonding process, a heat treatment is performed at the atmosphere of nitrogen ($N_2$) at 130° C. for five minutes. Accordingly, a void on the bonding face of the second intermediate layer 31 formed from an acrylic resin (refractive index n2=1.5) is removed, and the surface of the bonding face is flattened.

In addition, the formation of the second intermediate layer 31 is not limited to the bonding of the resin sheet but, for example, spin coating of the resin material described in the first embodiment or a coating method such as a printing method may be used.
[A of FIG. 8]

In addition, as illustrated in A of FIG. 8, for example, on one principal face side of a substrate 2 that is formed from single crystal silicon, photoelectric conversion units 21, a protective insulating film 23, a color filter layer 25, on-chip lenses 27*a*, and a first intermediate layer 29 are formed. The forming method thereof is performed in the same procedure as that of the first embodiment described with reference to A of FIG. 4 to C of FIG. 4.

The substrate 2 formed up to the first intermediate layer 29 and the transparent substrate 41 formed up to the second intermediate layer 31 are arranged such that the first intermediate layer 29 and the second intermediate layer 31 face each other. At this time, position adjustment is performed such that one micro-lens 10*b* is arranged so as to face each nine on-chip lenses 27*a* arranged in 3×3 pixels.
[B of FIG. 8]

Thereafter, as illustrated in B of FIG. 8, the substrate 2 and the transparent substrate 41 are bonded between the first intermediate layer 29 and the second intermediate layer 31. At this time, thermobonding is performed under the heating condition of 110° C. Thereafter, at the atmosphere of nitrogen ($N_2$), a heat treatment is performed at 130° C. for five minutes. Accordingly, the second intermediate layer 31 that is formed from an acrylic resin sheet is cured, and the bonding between the second intermediate layer 31 and the first intermediate layer 29, for example, formed from fluorine-containing polysiloxane resin (refractive index n1=1.42) can be reliably performed.

As above, the solid-state imaging apparatus 1*b* according to the second embodiment described with reference to FIG. 6 can be acquired.
[Advantages of Second Embodiment]

According to the above-described second embodiment, the transparent material layer that is formed from the first intermediate layer 29 and the second intermediate layer 31 is interposed between the on-chip lens 27*a* and the micro-lens 10*b* that is arranged in correspondence with a plurality of on-chip lenses 27*a* in the upper part thereof. Accordingly, similarly to the first embodiment, from the photoelectric conversion unit 21 under the on-chip lens 27*a* to the micro-lens 10*b* are integrally configured without a space portion interposed therebetween. Accordingly, similarly to the first embodiment, even under a high-temperature and high humidity usage environment, it is difficult for the optical axis mismatch between the on-chip lens 27*a* and the micro-lens 10*b* to occur due to a difference in the thermal expansion coefficient. As a result, the image quality of an image captured by the compound-eye system solid-state imaging apparatus can be improved regardless of the use environment. In addition, since this solid-state imaging apparatus 1*b* has an integrated structure without having a space portion interposed therebetween, an image quality having superior sensitivity characteristics and reduced flare ghost can be provided.

In addition, also in the second embodiment, the transparent material layer that is interposed between the on-chip lens 27*a* and the micro-lens 10*b* is configured to have a structure in which the first intermediate layer 29 disposed on the on-chip lens 27*a* side and the second intermediate layer 31 disposed on the micro-lens 10*b* side are stacked. Accordingly, the second intermediate layer 31 can be configured by using a material that can implement a thick film in accordance with the focal distance of the micro-lens 10*b* having a large diameter, and the first intermediate layer 29 can be configured by using a material having a refractive index n1 that is in consideration of only the light condensing capability of the on-chip lens 27*a*.

As a result, in the compound-eye system solid-state imaging apparatus 1*b*, while the focal distance of the micro-lens 10*b* having a large diameter is secured, a distance between the on-chip lens 27*a* and the photoelectric conversion unit 21 decreases, whereby a decrease in the sensitivity due to penetration of inclined incidence light from adjacent pixels 3 can be prevented.

<<4. Third Embodiment (Example in which Concave-Type on-Chip Lens+Concave-Type Micro-Lens are Used) >>
[Configuration of Solid-State Imaging Apparatus of Third Embodiment]

FIG. 9 is a cross-sectional view of a main portion of a solid-state imaging apparatus 1*c* according to the third embodiment. A difference between the compound-eye system solid-state imaging apparatus shown in the diagram and the other solid-state imaging apparatuses is that an on-chip lens 27*b* is configured as a concave type in the compound-eye system solid-state imaging apparatus, and the configurations other than the on-chip lens 27*b* are similar to those according to the second embodiment.

In other words, in the compound-eye system solid-state imaging apparatus 1c, (A) an on-chip lens 27b, (B) a first intermediate layer 29, (C) a second intermediate layer 31, and (D) a micro-lens 10b are disposed in this order on a photoelectric conversion unit 21 through a protective insulating film 23 and a color filter layer 25. Among these, (B) the first intermediate layer 29, (C) the second intermediate layer 31, and (D) the micro-lens 10b have the same configurations as those of the second embodiment. The configuration of (A) the on-chip lens 27b is as follows.

(A) The on-chip lens 27b is a concave-type lens that is concave in the light incidence direction and is convex to the color filter layer 25 side. Such an on-chip lens 27b is composed of a transparent material having a refractive index n0 that has a sufficient difference from the refractive index n1 of the first intermediate layer 29. Especially, here, since on-chip lens 27b is a concave-type lens, the refractive index n0 of the on-chip lens 27b and the refractive index n1 of the first intermediate layer 29 have the relation of "n0<n1".

Here, it is preferable that the materials of the first intermediate layer 29 and the second intermediate layer 31 having refractive indices close to each other are used. The refractive index n1 of the first intermediate layer 29 and the refractive index n2 of the second intermediate layer 31 have the relation of "n1≅n2", which is similar to that of the other embodiments. For example, in a case where a material having a refractive index n1=about 1.5 is used as the material of the first intermediate layer 29, a material that has a refractive index of n0<1.5 and has the relationship of |n0−n1|>|n0−n2| is used as the material of the on-chip lens 27b. In addition, the film thickness t2 of the second intermediate layer 31 and the film thickness t1 of the first intermediate layer 29 have the relation of "t2>t1".

[Method of Manufacturing Solid-State Imaging Apparatus of Third Embodiment]

FIGS. 10 and 11 are cross-sectional process diagrams that illustrate a manufacturing procedure of the solid-state imaging apparatus according to the third embodiment. Hereinafter, a method of manufacturing the solid-state imaging apparatus according to the third embodiment illustrated in FIG. 9 will be described in accordance with the diagrams.

[A of FIG. 10]

First, as illustrated in A of FIG. 10, a micro-lens 10b is formed on a transparent substrate 41 that is formed from a glass material or a plastic material. The formation of the micro-lens 10b, for example, is performed in a procedure that is the same as that described in the second embodiment with reference to A of FIG. 7 to C of FIG. 7.

[B of FIG. 10]

First, as illustrated in B of FIG. 10, a second intermediate layer 31 is formed on a transparent substrate 41 on which a micro-lenses 10b are formed. This second intermediate layer 31 is formed to have a film thickness t2 together with a first intermediate layer formed next in consideration of the focal distance of the micro-lens 10b. The formation of such a second intermediate layer 31 is performed by using a spin coat method described in the first embodiment with reference to D of FIG. 4, a coating method such as a printing method, or bonding a resin sheet described in the second embodiment with reference to D of FIG. 7.

[C of FIG. 10]

First, as illustrated in C of FIG. 10, a first intermediate layer 29 having a convex lens shape on the surface thereof is formed on a second intermediate layer 31. Here, for example, by using a melt flow method, a resist pattern is formed in a convex lens shape, and a first intermediate layer 29 that connects each convex lens shape to the bottom portion to be continuous thereto is formed. At this time, convex lens shapes corresponding to 3×3 are formed for each micro-lens 10b.

[D of FIG. 10]

Thereafter, as illustrated in D of FIG. 10, convex lens shapes formed on the surface of the second intermediate layer 31 are embedded on the second intermediate layer 31, and the lens material film is formed as a film so as to flatten the surface, whereby on-chip lenses 27b each having a concave lens shape following each convex lens shape are formed.

[A of FIG. 11]

In addition, as illustrated in A of FIG. 11, for example, on one principal face side of a substrate 2 that is formed from single crystal silicon, photoelectric conversion units 21, a protective insulating film 23, and a color filter layer 25 are formed. The forming method thereof is performed in the same procedure as that of the first embodiment described with reference to A of FIG. 4.

The substrate 2 formed up to the color filter layer 25 and the transparent substrate 41 formed up to the on-chip lens 27b are arranged such that the color filter layer 25 and the on-chip lens 27b face each other. At this time, position adjustment is performed such that the on-chip lenses 27b and the photoelectric conversion units 21 are arranged so as to face each other.

[B of FIG. 11]

Thereafter, as illustrated in B of FIG. 11, the substrate 2 and the transparent substrate 41 are bonded between the color filter layer 25 and the on-chip lens 27b. At this time, thermobonding is performed under a heating condition. Thereafter, a heat treatment is performed at the atmosphere of nitrogen ($N_2$) as is necessary, and accordingly, the bonding between the on-chip lens 27b and the color filter layer 25 are assured.

As above, the solid-state imaging apparatus 1c according to the third embodiment described with reference to FIG. 9 can be acquired.

[Advantages of Third Embodiment]

According to the above-described third embodiment, the transparent material layer that is formed from the first intermediate layer 29 and the second intermediate layer 31 is interposed between the on-chip lens 27b and the micro-lens 10b that is arranged in correspondence with a plurality of on-chip lenses 27b in the upper part thereof. Accordingly, similarly to the other embodiments, from the photoelectric conversion unit 21 under the on-chip lens 27b to the micro-lens 10b are integrally configured without a space portion interposed therebetween. Accordingly, similarly to the other embodiments, even under a high-temperature and high humidity usage environment, it is difficult for the optical axis mismatch between the on-chip lens 27b and the micro-lens 10b to occur due to a difference in the thermal expansion coefficient. As a result, the image quality of an image captured by the compound-eye system solid-state imaging apparatus can be improved regardless of the use environment. In addition, since this solid-state imaging apparatus 1c has an integrated structure without having a space portion interposed therebetween, an image quality having superior sensitivity characteristics and reduced flare ghost can be provided.

In addition, also in the third embodiment, the transparent material layer that is interposed between the on-chip lens 27b and the micro-lens 10b is configured to have a structure in which the first intermediate layer 29 disposed on the on-chip lens 27b side and the second intermediate layer 31 disposed on the micro-lens 10b side are stacked. Accordingly, the second intermediate layer 31 can be configured by using a material that can implement a thick film in accordance with the focal distance of the micro-lens 10b having a large diameter, and the first intermediate layer 29 can be configured by using a material having a refractive index n1 that is in consideration of only the light condensing capability of the on-chip lens 27b.

As a result, in the compound-eye system solid-state imaging apparatus 1c, while the focal distance of the micro-lens 10b having a large diameter is secured, a distance between the on-chip lens 27b and the photoelectric conversion unit 21 decreases, whereby a decrease in the sensitivity due to penetration of inclined incidence light from adjacent pixels 3 can be prevented.

<<5. Fourth Embodiment (Embodiment of Electronic Apparatus) >>

The solid-state imaging apparatuses according to the above-described embodiments of the present disclosure can be applied to an electronic apparatus such as a camera system including a digital camera and a video camera, a small-size mobile terminal or a computer that is provided with an imaging function, or a robot vision having an imaging function.

FIG. 12 is a configuration diagram of a camera using the solid-state imaging apparatus as an example of an electronic apparatus according to the present disclosure. The camera according to this embodiment is an example of a video camera that can capture a still image or a moving image. The camera 91 according to this embodiment includes a solid-state imaging apparatus 1, an optical system 93 that guides incident light to a light receiving sensor unit of the solid-state imaging apparatus 1, a shutter device 94, a driving circuit 95 that drives the solid-state imaging apparatus 1, and a signal processing circuit 96 that processes the output signal of the solid-state imaging apparatus 1.

As the solid-state imaging apparatus 1, the solid-state imaging apparatuses (1a to 1c) described in the above-described embodiments are used. The optical system (optical lens) 93 forms image light (incident light) transmitted from a subject on the imaging face of the solid-state imaging apparatus 1. Accordingly, signal electric charge is accumulated within the solid-state imaging apparatus 1 during certain period. The optical system 93 may be an optical lens system that is configured by a plurality of optical lenses. The shutter device 94 controls a light emission period and a light shielding period of the solid-state imaging apparatus 1. The driving circuit 95 supplies driving signals that are used for controlling the transmission operation of the solid-state imaging apparatus 1 and the shutter operation of the shutter device 94. The solid-state imaging apparatus 1 transmits a signal in accordance with a driving signal (timing signal) that is supplied from the driving circuit 95. The signal processing circuit 96 performs various signal processing operations. A video signal for which signal processing has been performed is stored in a storage medium such as a memory or is output to a monitor.

According to the electronic apparatuses according to the embodiments described above, by using the compound-eye system solid-state imaging apparatus 1 that improves the image quality of a captured image regardless of the use environments, the reliability of the electronic apparatus including the compound-eye system solid-state imaging apparatus can be improved.

1. The present technology may have the following configurations.

(1) There is provided a solid-state imaging apparatus including: photoelectric conversion units that are two-dimensionally arranged; on-chip lenses that are two-dimensionally arranged on an upper side of the photoelectric conversion units in correspondence with the photoelectric conversion units; a micro-lens that is arranged so as to face each plurality of the on-chip lenses; and a transparent material layer that is pinched between the on-chip lenses and the micro-lens.

(2) The solid-state imaging apparatus described in (1), wherein the transparent material layer includes a first intermediate layer that covers the on-chip lenses and is flattened on a surface and a second intermediate layer that is arranged between the first intermediate layer and the micro-lens.

(3) The solid-state imaging apparatus described in (2), wherein, when a refractive index of the on-chip lens is n0, a refractive index of the first intermediate layer is n1, and a refractive index of the second intermediate layer is n2, relation of $|n0-n1|>|n0-n2|$ is satisfied.

(4) The solid-state imaging apparatus described in (2) or (3), wherein a film thickness of the second intermediate layer is larger than a film thickness of the first intermediate layer.

(5) The solid-state imaging apparatus described in any one of (1) to (4), wherein a focal distance of the on-chip lens is smaller than a size of each pixel in which the photoelectric conversion unit is arranged.

(6) There is provided a method of manufacturing a solid-state imaging apparatus including: forming a transparent material layer that is pinched between on-chip lenses arranged in correspondence with photoelectric conversion units on an upper side of the photoelectric conversion units that are two-dimensionally arranged and a micro-lens that is arranged so as to face each plurality of the on-chip lenses on a substrate on which the photoelectric conversion units and the on-chip lenses are formed or a substrate on which the micro-lens is formed.

(7) The method of manufacturing a solid-state imaging apparatus described in (6), wherein the forming of the transparent material layer includes forming a first intermediate layer of which a surface is flattened in a state covering the on-chip lenses and forming a second intermediate layer that is arranged between the first intermediate layer and the micro-lens.

(8) The method of manufacturing a solid-state imaging apparatus described in (7), wherein, when a refractive index of the on-chip lens is n0, a refractive index of the first intermediate layer is n1, and a refractive index of the second intermediate layer is n2, relation of $|n0-n1|>|n0-n2|$ is satisfied.

(9) The method of manufacturing a solid-state imaging apparatus that is described in (7) or (8), further including: forming the first intermediate layer and the second intermediate layer in this order on a substrate on which the photoelectric conversion units and the on-chip lenses disposed in the upper portion of the photoelectric conversion unit; and forming the micro-lens on an upper portion of the second intermediate layer.

(10) The method of manufacturing a solid-state imaging apparatus that is described in (7) or (8), further including: forming the first intermediate layer on the substrate on which the on-chip lenses are formed; forming the second intermediate layer on the substrate on which the micro-lens is formed; and bonding the two substrates by allowing the first intermediate layer and the second intermediate layer to face each other.

(11) The method of manufacturing a solid-state imaging apparatus that is described in (7) or (8), further including:

forming the second intermediate layer of which a surface is flattened by covering the micro-lens on the substrate on which the micro lens is formed; forming the first intermediate layer, which has lens shapes acquired by reversing the on-chip lenses on the surface, on the second intermediate layer; and forming the on-chip lenses of which the surface is flattened by embedding the lens shapes of the first intermediate layer on the first intermediate layer; and bonding the substrate on which the photoelectric conversion units are formed and the substrate on which the on-chip lenses are formed by allowing the photoelectric conversion units and the on-chip lenses to face each other.

(12) There is provided an electronic apparatus including: photoelectric conversion units that are two-dimensionally arranged; on-chip lenses that are two-dimensionally arranged on an upper side of the photoelectric conversion units in correspondence with the photoelectric conversion units; a micro-lens that is arranged so as to face each plurality of the on-chip lenses; a transparent material layer that is pinched between the on-chip lenses and the micro-lens; an optical system that guides incident light to the micro-lens; and a signal processing circuit that processes an output signal output from the photoelectric conversion unit.

REFERENCE SIGNS LIST 1, 1a, 1b, and 1c: solid-state imaging apparatus
2: substrate
10, 10a, and 10bc: micro-lens
21: photoelectric conversion unit
27 and 27c: on-chip lens
29: first intermediate layer (transparent material layer)
31: second intermediate layer (transparent material layer)
41: transparent substrate
91: electronic apparatus
93: optical system
96: signal processing circuit
n0: refractive index of on-chip lens
n1: refractive index of first intermediate layer
n2: refractive index of second intermediate layer
t2: film thickness of second intermediate layer

The invention claimed is:

1. An electric apparatus, comprising:
signal processing circuitry; and
an imaging device, wherein the imaging device comprises:
　a plurality of photoelectric conversion units two-dimensionally arranged;
　a plurality of on-chip lenses two-dimensionally arranged in correspondence with respective ones of the plurality of photoelectric conversion units;
　a micro-lens in a light receiving side of the plurality of on-chip lenses,
　　wherein light is incident on the plurality of on-chip lenses through the micro lens; and
　a transparent material layer pinched between the plurality of on-chip lenses and the micro-lens,
　　wherein the signal processing circuitry is configured to process a signal output from the imaging device.

2. The electric apparatus according to claim 1,
wherein the transparent material layer includes a first intermediate layer and a second intermediate layer,
wherein the first intermediate layer covers the plurality of on-chip lenses and is flattened on a surface thereof, and
wherein the second intermediate layer is arranged between the first intermediate layer and the micro-lens.

3. The electric apparatus according to claim 2,
wherein the plurality of photoelectric conversion units are present in a substrate,
wherein the plurality of on-chip lenses are present on an upper portion of the respective ones of the plurality of photoelectric conversion units; and
wherein the micro-lens is present on an upper portion of the second intermediate layer.

4. The electric apparatus according to claim 2, wherein a refractive index (n0) of respective ones of the plurality of on-chip lenses, a refractive index (n1) of the first intermediate layer, and a refractive index (n2) of the second intermediate layer satisfy a relation of $|n0-n1|>|n0-n2|$.

5. The electric apparatus according to claim 2, wherein a film thickness of the second intermediate layer is larger than a film thickness of the first intermediate layer.

6. The electric apparatus according to claim 1, wherein a focal distance of respective ones of the plurality of on-chip lenses is smaller than a size of a respective pixel in which a photoelectric conversion unit of the plurality of photoelectric conversion units is arranged.

7. The electric apparatus according to claim 1,
wherein the transparent material layer includes a first intermediate layer and a second intermediate layer,
wherein the first intermediate layer covers the plurality of on-chip lenses,
wherein the second intermediate layer is arranged between the first intermediate layer and the micro-lens, and
wherein a refractive index of the first intermediate layer and a refractive index of the second intermediate layer are same.

8. The electric apparatus according to claim 1, wherein the imaging device further comprises:
a first intermediate layer present on a first substrate on which the plurality of on-chip lenses are present, and
a second intermediate layer present on a second substrate on which the micro-lens is present,
　wherein the first intermediate layer faces the second intermediate layer, and
　wherein the second substrate on which the micro-lens is present and the first substrate on which the plurality of on-chip lenses are present are bonded.

* * * * *